(12) United States Patent
Ware et al.

(10) Patent No.: US 10,402,110 B2
(45) Date of Patent: Sep. 3, 2019

(54) ADJUSTABLE ACCESS ENERGY AND ACCESS LATENCY MEMORY SYSTEM AND DEVICES

(71) Applicant: Rambus Inc., Sunnyvale, CA (US)

(72) Inventors: Frederick A. Ware, Los Altos Hills, CA (US); John Eric Linstadt, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 62 days.

(21) Appl. No.: 15/642,860

(22) Filed: Jul. 6, 2017

(65) Prior Publication Data
US 2018/0039416 A1   Feb. 8, 2018

Related U.S. Application Data

(60) Provisional application No. 62/370,919, filed on Aug. 4, 2016.

(51) Int. Cl.
| | |
|---|---|
| G06F 3/06 | (2006.01) |
| G11C 11/4091 | (2006.01) |
| G11C 7/06 | (2006.01) |
| G11C 7/18 | (2006.01) |
| G11C 7/22 | (2006.01) |
| G11C 11/4076 | (2006.01) |
| G11C 11/4097 | (2006.01) |

(52) U.S. Cl.
CPC ............ *G06F 3/064* (2013.01); *G06F 3/0611* (2013.01); *G06F 3/0625* (2013.01); *G06F 3/0655* (2013.01); *G06F 3/0673* (2013.01); *G11C 7/06* (2013.01); *G11C 7/18* (2013.01); *G11C 7/22* (2013.01); *G11C 11/4076* (2013.01); *G11C 11/4091* (2013.01); *G11C 11/4097* (2013.01)

(58) Field of Classification Search
USPC ........................................................ 711/154
See application file for complete search history.

(56) References Cited

U.S. PATENT DOCUMENTS

| | | | |
|---|---|---|---|
| 5,319,755 A | 6/1994 | Farmwald et al. | |
| 5,721,957 A * | 2/1998 | Huang | G06F 9/3816 710/30 |
| 5,818,768 A | 10/1998 | Sawada et al. | |
| 6,246,614 B1 | 6/2001 | Ooishi | |

(Continued)

FOREIGN PATENT DOCUMENTS

CA         2379593 A1    9/2002

*Primary Examiner* — Hashem Farrokh
(74) *Attorney, Agent, or Firm* — The Neudeck Law Firm, LLC

(57) ABSTRACT

Same sized blocks of data corresponding to a single read/write command are stored in the same memory array of a memory device, but using different formats. A first one of these formats spreads the data in the block across a larger number of memory subarrays (a.k.a., memory array tiles—MATs) than a second format. In this manner, the data blocks stored in the first format can be accessed with lower latency than the blocks stored in the second format because more data can be read from the array simultaneously. In addition, since the data stored in the second format is stored in fewer subarrays, it takes less energy to read a block stored in the second format. Thus, a system may elect, on a data block by data block basis, whether to conserve power or improve speed.

20 Claims, 9 Drawing Sheets

(56) References Cited

U.S. PATENT DOCUMENTS

| | | |
|---|---|---|
| 6,337,832 B1 | 1/2002 | Ooishi et al. |
| 6,345,348 B2 | 2/2002 | Watanabe et al. |
| 6,370,077 B1 | 4/2002 | Koyanagi et al. |
| 6,426,908 B1 | 7/2002 | Hidaka |
| 6,549,483 B2 | 4/2003 | Kurjanowicz et al. |
| 6,681,388 B1 * | 1/2004 | Sato ............... G06F 8/453 717/149 |
| 7,032,092 B2 | 4/2006 | Lai |
| 7,254,075 B2 | 8/2007 | Woo et al. |
| 7,545,382 B1 * | 6/2009 | Montrym ............. G06T 1/60 345/530 |
| 7,613,883 B2 | 11/2009 | Bellows et al. |
| 7,681,005 B1 | 3/2010 | Mailloux et al. |
| 8,305,834 B2 | 11/2012 | Richter et al. |
| 8,355,270 B2 | 1/2013 | Nakaoka et al. |
| 8,364,926 B2 | 1/2013 | Hampel et al. |
| 9,234,400 B2 | 1/2016 | Warnock, Jr. et al. |
| 2007/0002601 A1 | 1/2007 | Hasunuma et al. |
| 2008/1065606 | 7/2008 | You |
| 2013/0268728 A1 | 10/2013 | Ramanujan et al. |
| 2014/0003113 A1 | 1/2014 | Seno et al. |
| 2014/0104916 A1 | 4/2014 | Noda et al. |
| 2015/0104919 A1 | 4/2015 | Narui |
| 2015/0155016 A1 | 6/2015 | Ku |
| 2017/0277637 A1 * | 9/2017 | Willcock ............ G06F 12/0871 |

\* cited by examiner

ADJUSTABLE ACCESS ENERGY AND ACCESS LATENCY MEMORY SYSTEM AND DEVICES

DETAILED DESCRIPTION OF THE EMBODIMENTS

Computer systems often seek to maximize energy/power, latency, bandwidth, capacity, and cost. The selected metrics that are optimized, however, are typically fixed when the device, module, or system is designed. In an embodiment, however, a memory system or device is configured such that the computer system can dynamically select between improving energy/power consumption or improving overall access latency (i.e., access latency plus transport/communication latency). Accordingly, same sized blocks of data corresponding to a single read/write command are stored in the same memory array of a memory device (e.g., DRAM), but using different formats. In particular, a first one of these formats spreads the data in the block across a larger number of memory subarrays (a.k.a., memory array tiles—MATs) than a second format. In this manner, the data blocks stored in the first format can be accessed with lower overall latency than the blocks stored in the second format.

Because of the formatting, blocks stored in the first format can be accessed and communicated by using more bits in parallel (i.e., higher bandwidth) and fewer sub-column accesses per subarray than blocks stored in the second format. Thus, because the accessed data blocks stored in the first format are accessed and communicated using more parallelism than blocks stored in the second format, blocks in the first format can be accessed with a shorter overall latency when compared to accessing blocks stored in the second format.

In addition, because of the formatting, blocks stored in second format require the activation of fewer subarrays than accessing blocks stored in the first format. Because the activation of each individual subarray consumes energy, accessing blocks stored in the second format requires less energy than accessing blocks stored in the first format. However, this energy savings is at the expense of having a greater overall latency for accesses that use the second format when compared to accesses that use the first format.

Figure 1A:
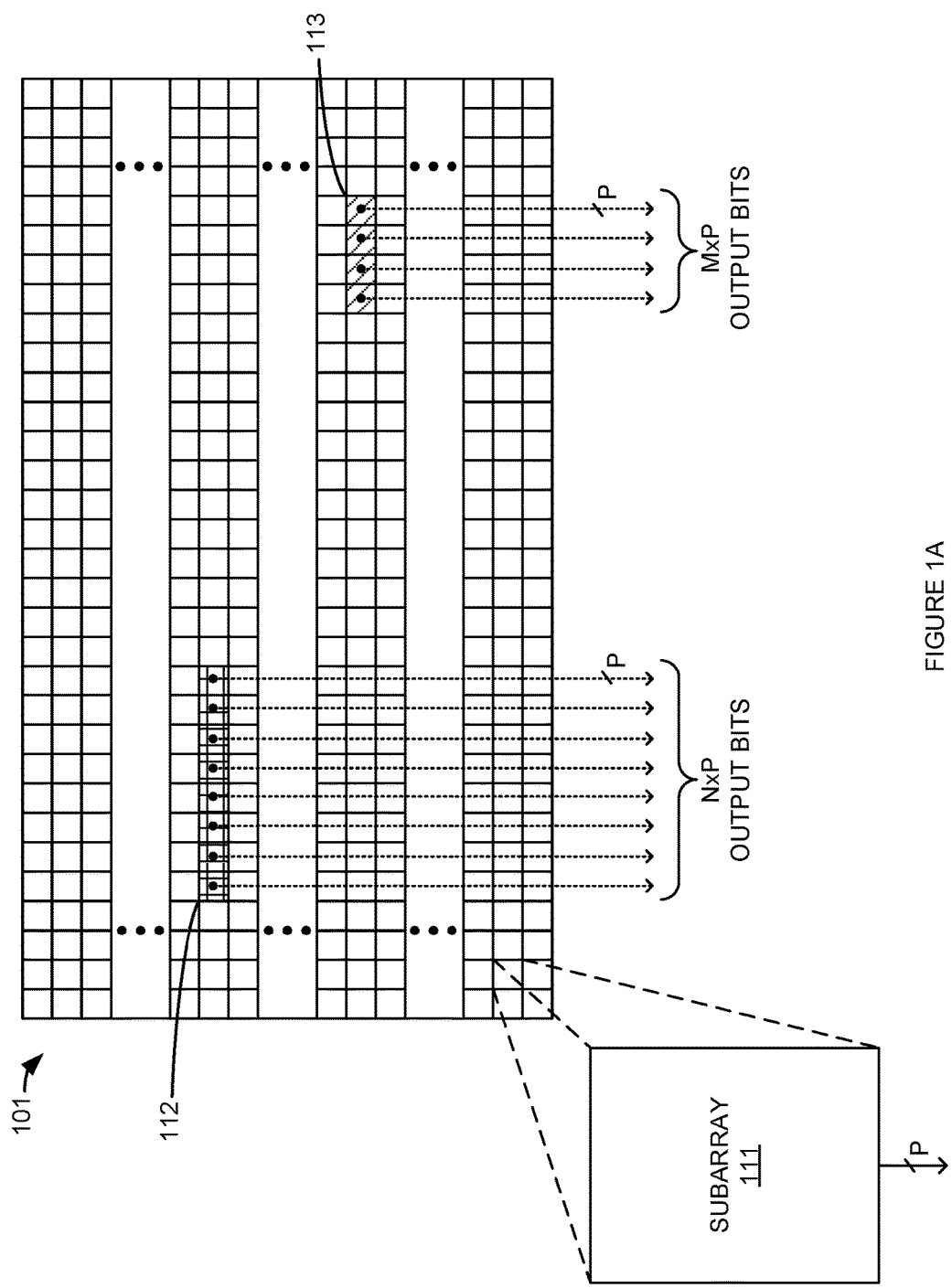
FIG. 1A illustrates a memory array of a memory device.

FIG. 1A illustrates a memory array of a memory device. In FIGS. 1A-1D memory array 101 is illustrated as an array of subarrays 111 arranged into rows and columns. Subarrays 111 may also be referred to as memory array tiles (MATs). Each subarray 111 produces P number of bits simultaneously when accessed. N number of subarrays 112 are illustrated as storing a block of data in a first (i.e., low-latency) format. M number of subarrays 113 are illustrated as storing a block of data in a second (i.e., low-energy) format. In an embodiment, the blocks of data stored in the first format and the second format are the same size.

In FIG. 1A, N is illustrated as be eight (8), and M is illustrated as being four (4). However, it should be understood that, depending on the formatting selected, other numbers of subarrays may be used to store the data blocks. These other selected numbers may correspond to additional storage formats that have correspondingly different latency and/or access energy.

Figure 1B:
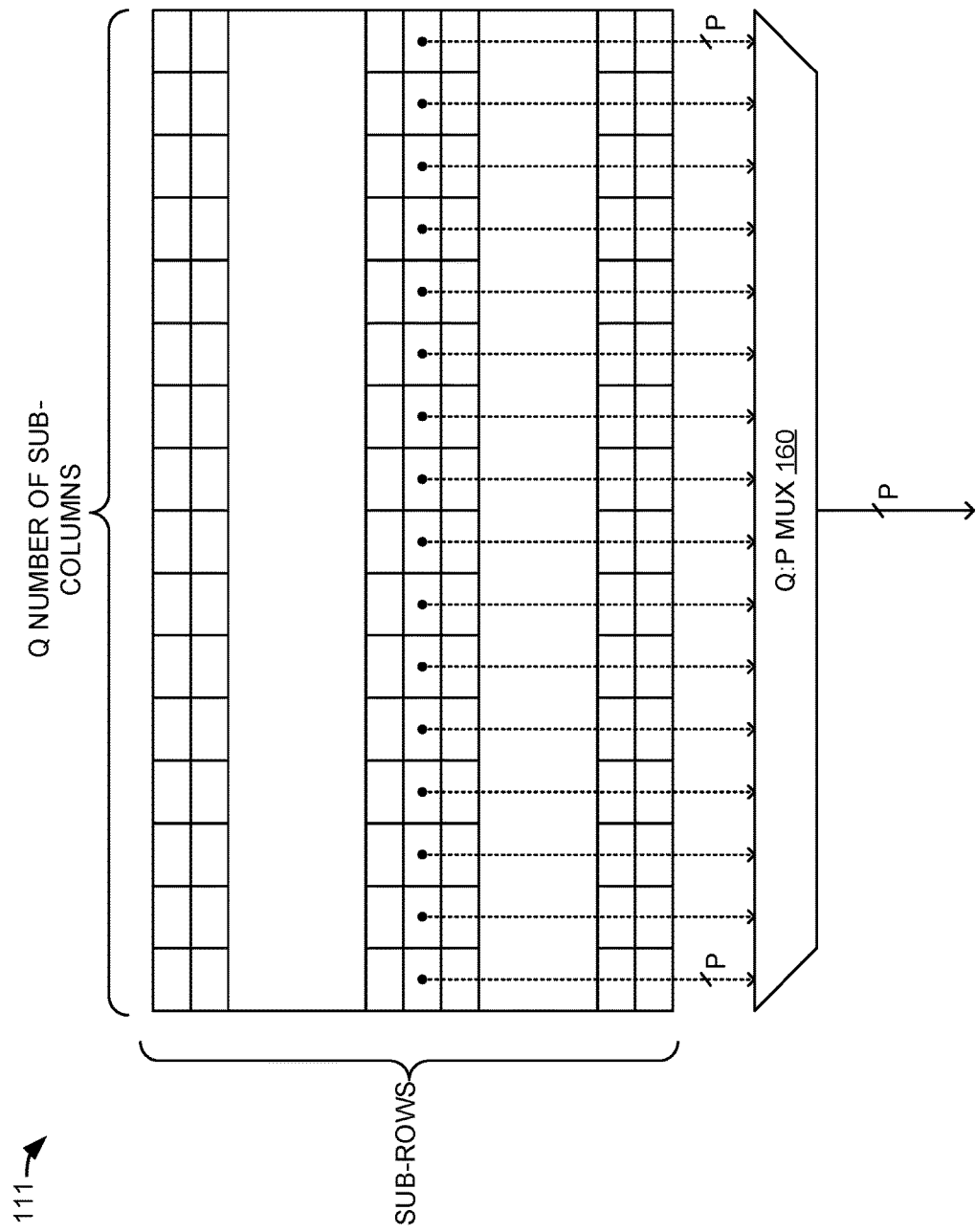
FIG. 1B illustrates a subarray of the memory array of the memory device.

FIG. 1B illustrates a subarray of the memory array of the memory device. Each subarray 111 of memory array 101 is comprised of memory cells arranged into sub-rows and sub-columns, sense amplifiers (not shown in FIGS. 1A-1B) and a column multiplexer (MUX) 160. Each sub-row of subarray 111 is further divided into Q number of sub-columns. Each sub-column of subarray 111 produces P number of bits simultaneously from their sense amplifiers of when accessed. Thus, when a sub-row of subarray 111 is accessed, Q×P number of bits are output from the sense amplifiers of the accessed sub-row and input to MUX 160. MUX 160 selects one (1) set of P number of bits to be output from subarray 111. Accordingly, it should be understood that one activation of one sub-row of a subarray 111 can be used for multiple accesses to different sub-columns simply by changing which bits (e.g., sub-column) MUX 160 is controlled to select. In an example, P is selected to equal 36. In this example, 32 of these 36 bits may correspond to data, and 4 of the 36 correspond to error control information (e.g., ECC coding.) In another example, P is selected to equal 32.

Returning now to FIG. 1A, as discussed herein, each subarray 111 can output P number of bits simultaneously when accessed for a read operation. Thus, for data stored in the first format, N number of subarrays are activated such that the activation of these N subarrays and a single subsequent sub-column selection results in N×P bits being output from array 101. In other words, each sub-column selection results in P number of bits being moved from the sense amplifiers of the corresponding sub-column of each of N subarrays 111 for further transfer to an interface (e.g., internal data bus and/or external interface.) For data stored in the second format, M number of subarrays are activated such that the activation of these M subarrays and a single subsequent sub-column selection results in M×P bits being output from array 101. In other words, each sub-column selection results in P number of bits being moved from the sense amplifiers of the corresponding sub-column of each of M subarrays 111 for further transfer to an interface (e.g., internal data bus and/or external interface.)

Figure 1C:
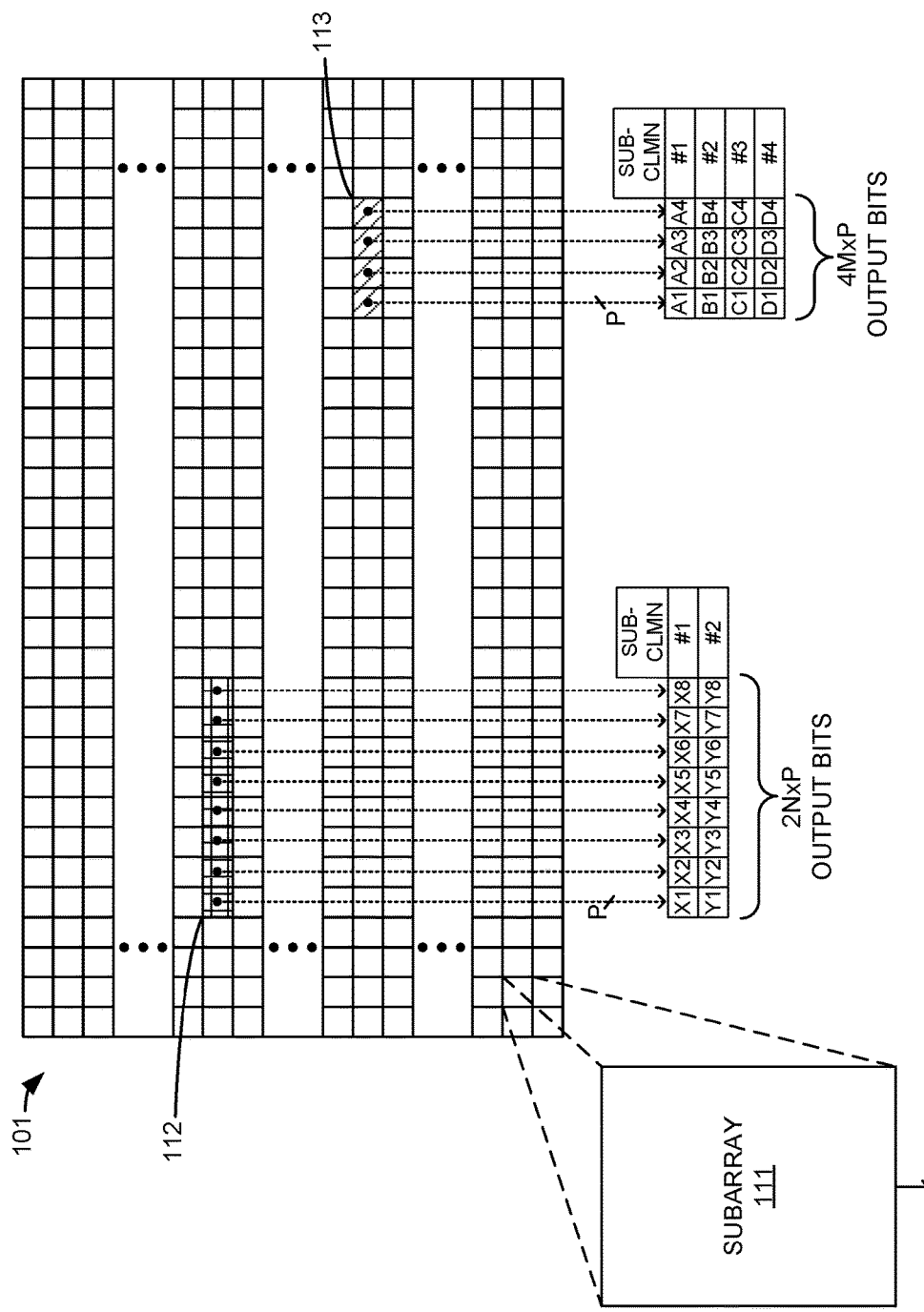
FIG. 1C illustrates low-latency and low-energy subarray accesses.

FIG. 1C illustrates low-latency and low-energy subarray accesses. In FIG. 1C, subarrays 112 (which are storing a data block in the first format) are illustrated outputting 2N×P number of bits as a result of two sub-column accesses (e.g., sub-column #1 and sub-column #2.) The outputs from a first sub-column access from each of the subarrays 112 are illustrated as N (e.g., 8) number of groups of P number of data bits labeled X1, X2, X3, X4, X5, X6, X7, and X8. The outputs from a second sub-column access from each of the subarrays 112 are illustrated as N (e.g., 8) number of groups of P number of data bits labeled Y1, Y2, Y3, Y4, Y5, Y6, Y7, and Y8. It should be understood that, depending on the size of the data block and the values of N and P, a different number than two (2) sub-column accesses may be used to read (and or store) a data block in the first format.

In FIG. 1C, subarrays 113 (which are storing a data block in the second format) are illustrated outputting 4N×P number of bits as a result of four sub-column accesses (e.g., sub-column #1, sub-column #2, sub-column #3, sub-column #4.) The outputs from a first sub-column access from each of the subarrays 113 are illustrated as M (e.g., 4) number of groups of P number of data bits labeled A1, A2, A3, and A4. The outputs from a second sub-column access from each of the subarrays 113 are illustrated as M number of groups of P number of data bits labeled B1, B2, B3, and B4. The outputs from a third sub-column access from each of the subarrays 113 are illustrated as M number of groups of P number of data bits labeled C1, C2, C3, and C4. The outputs from a fourth sub-column access from each of the subarrays 113 are illustrated as M number of groups of P number of data bits labeled D1, D2, D3, and D4. It should be understood that, depending on the size of the data block and the values of M and P, a different number than four (4) sub-column accesses may be used to read (and or store) a data block in the second format.

In an example, P=36, N=8, and M=4. Thus, for each sub-column access of a data block stored in the first format, 288 bits are output by sub-arrays 112. For each sub-column access of a data block stored in the second format, 144 bits are output by sub-arrays 113. Thus, in this example, access to a 288-bit block of data stored in the first format uses only one column access operation. In contrast, access to a 288-bit block of data stored in the second format uses two column access operations. In another example, access to a 576-bit block of data stored in the first format uses two column access operations and access to a 576-bit block of data stored in the second format uses four column access operations.

Figure 1D:
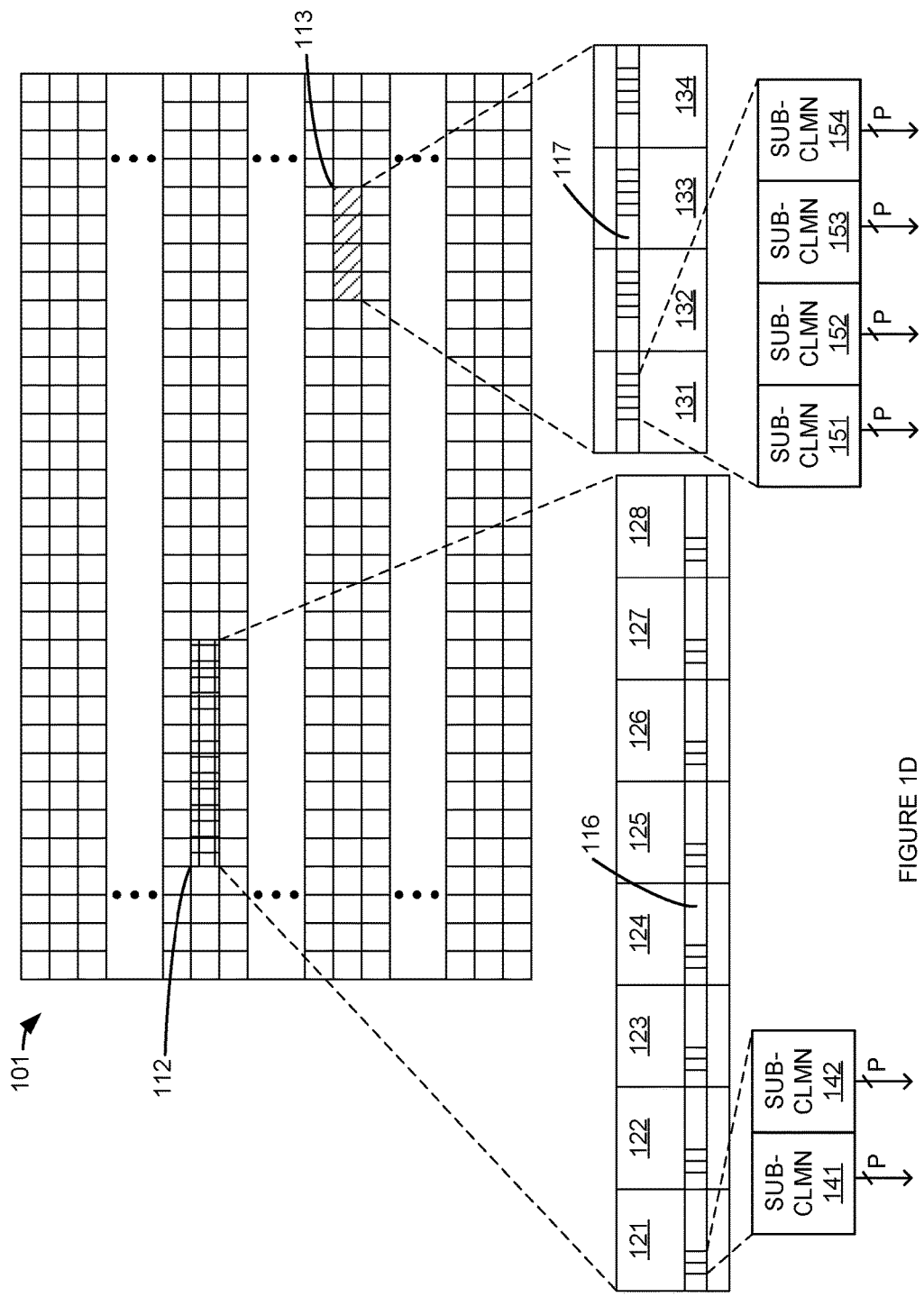
FIG. 1D illustrates low-latency and low-energy sub-column accesses.

FIG. 1D illustrates low-latency and low-energy sub-column accesses. In FIG. 1D, subarrays 112 storing a data block in the first format are illustrated as comprising subarrays 121-128. Subarrays 113 storing a data block in the second format are illustrated as comprising subarrays 131-134. To access a data block stored in the first format, a sub-row 116 in each of subarrays 121-128 is activated. A first sub-column access is made to a first sub-column 141 of the activated sub-row 116 of a first subarray 121 causing the first subarray 121 to output P number of bits (e.g., X1). A second sub-column access is made to a corresponding sub-column of a second subarray 122 causing the second subarray 122 to output P number of bits (e.g., X2), and so on until all of the activated subarrays 121-128 have output P number of bits (e.g., X1-X8.)

In an embodiment, after all of subarrays 121-128 have been accessed a first time, a second pass is made that accesses a different sub-column of the activated sub-row 116 of subarrays 121-128. In other words, a sub-column access is made to a second sub-column 142 of subarray 121 causing subarray 121 to output another P number of bits (e.g., Y1). A sub-column access is made to a corresponding sub-column of a subarray 122 causing subarray 122 to output P number of bits (e.g., Y2), and so on until all of the activated subarrays 121-128 have output a second round of P number of bits (e.g., Y1-Y8.)

To access a data block stored in the second format, a sub-row 117 in each of subarrays 131-134 is activated. A first sub-column access is made to a first sub-column 151 of the activated sub-row 117 of a first subarray 131 causing the first subarray 131 to output P number of bits (e.g., A1). A second sub-column access is made to a corresponding sub-column of a second subarray 132 causing the second subarray 132 to output P number of bits (e.g., A2), and so on until all of the activated subarrays 131-134 have output P number of bits (e.g., A1-A4.)

After all of subarrays 131-134 have been accessed a first time, a second pass is made that accesses a different sub-column of the activated sub-row 117 of subarrays 131-134. In other words, a sub-column access is made to a second sub-column 152 of the activated sub-row 117 of subarray 131 causing subarray 131 to output another P number of bits (e.g., B1). A sub-column access is made to a corresponding sub-column of a subarray 132 causing subarray 132 to output P number of bits (e.g., B2), and so on until all of the activated subarrays 131-134 have output a second round of P number of bits (e.g., B1-B4.)

After all of subarrays 131-134 have been accessed a second time, a third pass is made that accesses a different sub-column of subarrays 131-134. In other words, a sub-column access is made to a third sub-column 153 of the activated sub-row 117 of subarray 131 causing subarray 131 to output another P number of bits (e.g., C1). A sub-column access is made to a corresponding sub-column of the activated sub-row 117 of subarray 132 causing subarray 132 to output P number of bits (e.g., C2), and so on until all of the activated subarrays 131-134 have output a third round of P number of bits (e.g., C1-C4.)

Finally, after all of subarrays 131-134 have been accessed a third time, a fourth pass is made that accesses a different sub-column of the activated sub-row 117 of subarrays 131-134. In other words, a sub-column access is made to a fourth sub-column 154 of the activated sub-row 117 of subarray 131 causing subarray 131 to output another P number of bits (e.g., D1). A sub-column access is made to a corresponding sub-column of the activated sub-row 117 of a subarray 132 causing subarray 132 to output P number of bits (e.g., D2), and so on until all of the activated subarrays 131-134 have output a fourth round of P number of bits (e.g., D1-D4.)

Figure 2:
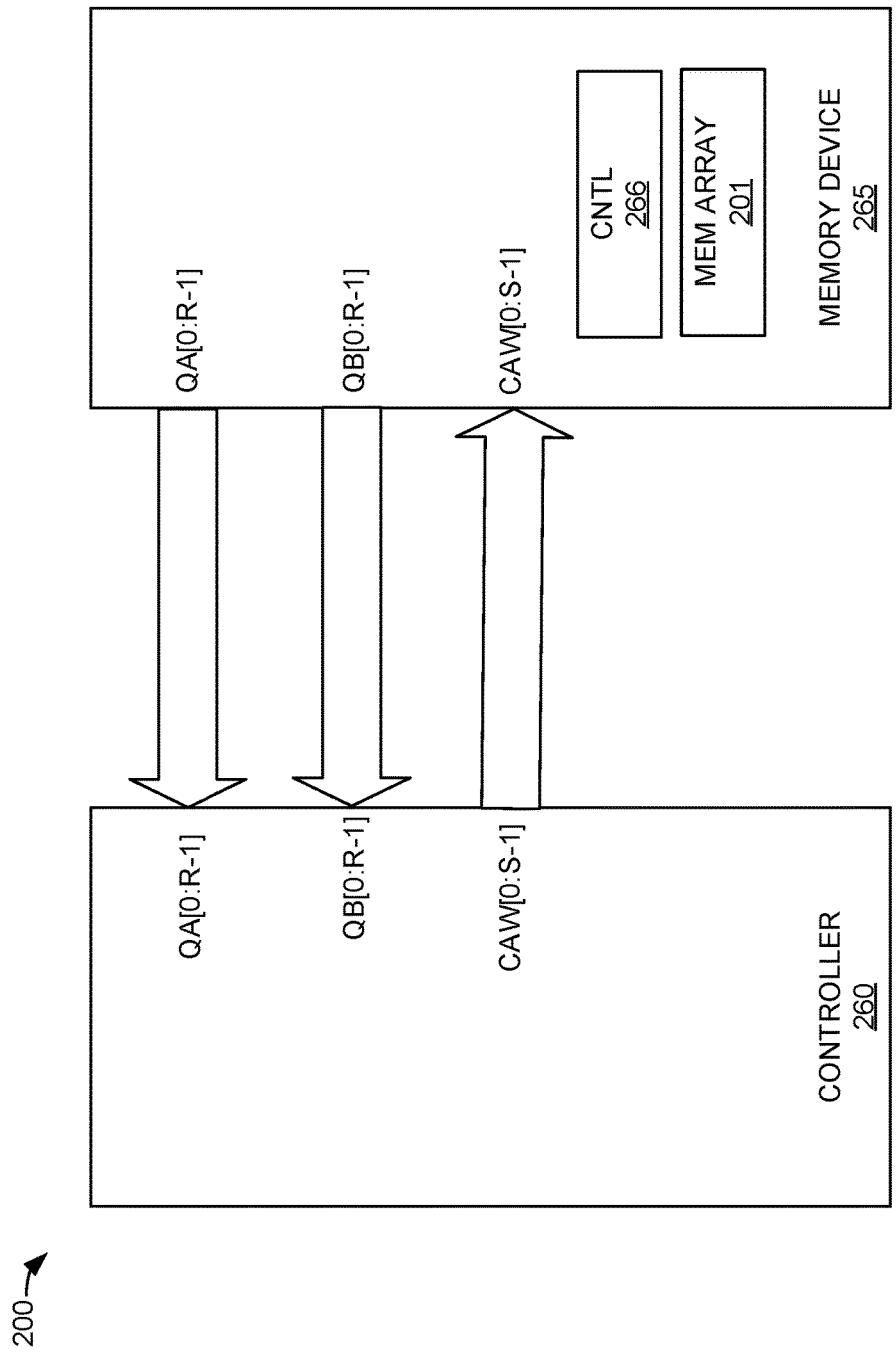
FIG. 2 illustrates a memory system.

FIG. 2 illustrates a memory system. In FIG. 2, memory system 200 comprises controller 260 and memory device 265. Memory device includes control circuitry 266 and at least one memory array 201. Memory array 201 may correspond and/or function as described herein with reference to memory array 101. Control circuitry 266 may control memory device 266 (and memory array 201 in particular) and/or other circuitry (not shown in FIG. 1A-1D or FIG. 2) to perform and/or function as described herein.

Controller 260 is operatively coupled to memory device 265. Controller 260 and memory device 265 are operatively coupled via a plurality of communication links. These communications links may comprise: a first unidirectional data bus comprised of R number of signals, QA[0:R-1]; a second unidirectional data bus comprised of R number of signals, QB[0:R-1]; a command/address/write data bus comprised of S number of signals, CAW[0:S-1]; one or more timing reference signals (not shown in FIG. 2). In an embodiment, R=3 and S=4. In another embodiment, one or both of links QA[ ] and/or QB[ ] are bidirectional.

Controller 260 and memory device 265 are integrated circuit type devices, such as those commonly referred to as "chips". A memory controller, such as controller 260, manages the flow of data going to and from memory devices. Functionality of a memory controller may be included on a single die with a microprocessor, or included as part of a more complex integrated circuit system as a block of a system on a chip (SOC). For example, a memory controller may be a northbridge chip, an application specific integrated circuit (ASIC) device, a load-reduction memory buffer, a graphics processor unit (GPU), a system-on-chip (SoC) or an integrated circuit device that includes many circuit blocks such as ones selected from graphics cores, processor cores, and MPEG encoder/decoders, etc.

Although a single memory device 265 is shown in FIG. 2, there may be multiple memory devices or chips disposed on a substrate and coupled to the controller 260 via one or more connector interface. Memory device 265 can include a dynamic random access memory (DRAM) core. Memory device 265 may include other types of memory cores. For example, memory device 265 may include static random access memory (SRAM) cores, or non-volatile memory cores such as flash. Controller 260 and memory device 265 may be interconnected with each other in a variety of system topologies including on a PC board (e.g., where memory device 265 is on a module and controller 260 is socketed to the PC board, or in "die-down" arrangement where one or both of the chips are soldered to the PC board), stacked one on top of another and encapsulated in a single package, or each having separate package (package-on-package), both disposed on a shared substrate, on an interposer, or even in a direct-attach arrangement. In addition, memory device 265 may be or comprise a stack of memory devices (e.g., DRAMs) co-packaged together and coupled to each other and/or controller 260 via wired bonds and/or through-silicon vias (TSVs). In various embodiment, controller 260 may or may not be included in the packaged stack of devices.

In an embodiment, controller 260 sends commands and addresses to memory device 265 via command/address bus signals CAW[0:S-1]. These commands and/or addresses may include one or more indicators (e.g., one or more bits) that determine what format is to be used when accessing (i.e., read or write) a data block in array 201. For example, a first type of command sent by controller 260 may indicate to memory device 265 that the data being accessed is to be read/written using a first format. This first format may correspond to a 'low-latency' format describe herein. A second type of command sent by controller 260 may indicate to memory device 265 that the data being accessed is to be read/written using a second format. This second format may correspond to a 'low-energy' format described herein.

In the case of a read command using a low-latency format, memory device 265 (and control circuitry 266, in particular) causes accesses memory array (i.e., bank) 201 and subarray (i.e., MATs) as described herein with respect to the first (low-latency) format discussed in relation to FIGS. 1A-1D to be performed. Likewise, in the case of a read command using a low-energy format, memory device 265 (and control circuitry 266, in particular) causes accesses memory array (i.e., bank) 201 and subarray (i.e., MATs) as described herein with respect to the second (low-energy) format discussed in relation to FIGS. 1A-1D to be performed. It should be understood from the discussion herein that the format selected to access a block of data in a bank determines the number of column access cycles required to access that data. Accordingly, the one or more one or more indicators included in a command and/or address also determine the number of column access operations to array 201 that are required to access that data.

In the case of a read command using the low-latency format, memory device 265 outputs (to controller 260) the data block read from a bank using both the QA and QB busses concurrently. This type of read command may also be referred to as a 'full-bandwidth' read command since the full output bandwidth of the QA and QB busses are being used to transfer data in response to that read command. In the case of a read command using the low-energy format, memory device 265 outputs (to controller 260) the data block read from a bank using only one of the QA and QB busses. This type of read command may also be referred to as a 'half-bandwidth' read command since only one of the QA and QB busses are being used to transfer data in response to that read command. It should be understood that when the data block being read is the same size for both the low-latency and low-energy read commands, the low-latency read command will transfer the data block in approximately ½ the time that a low-energy read command transfers a data block. Thus, the low-latency command completes in less time than a low-energy read command.

In an embodiment, controller 260 may send, via command/address bus signals CAW[0:S-1], two half-bandwidth read commands that are scheduled to return data at the same time. In response, memory device 265 may output the data block corresponding to the first half-bandwidth command on the QA bus while concurrently outputting the data block corresponding to the second half-bandwidth command on the QB bus.

As described herein, memory array 201 comprises subarrays that include both storage cells (e.g., DRAM cells) and sense amplifiers. Row and column access operations are performed on these subarrays of memory array 201 in order to access (i.e., read or write) these storage cells via the sense amplifiers. Control circuitry 266 is configured to access data blocks in array 201 of a selected size. Control circuitry 266 is also configured to access data blocks in array 201 of this selected size in at least two ways: (1) accessing a data block of the selected size utilizing a first number of subarrays of array 201, and (2) accessing a data block of the selected size utilizing a second number of subarrays of array 201, where the first and second number of subarrays are different. In other words, control circuitry 266 is configured such that it can access, from array 201, the same size data blocks, but using different numbers of subarrays. In an embodiment, these different numbers of subarray are selected such that, when compared to each other, utilizing the first number of subarrays of array 201 results in better overall access latency and using the second number of subarray of array 201 results in lower power/energy consumption.

Control circuitry may write the selected size data blocks into memory array 201 using different formats for the different ways of accessing memory array 201. In particular, a data block that is accessed utilizing the first number of subarrays of array 201 may be stored in a different format than a data block that is accessed utilizing the second number of subarrays of array 201. For example, a 288-bit data block that is stored across eight (8) subarrays of array 201 may be stored in two (2) 36-bit sub-columns of each of the eight subarrays. In contrast, another 288-bit data block may be stored across four (4) subarrays of array 201 using four (4) 36-bit sub-columns of each of the four subarrays. Thus, the location of at least some of the consecutively addressed bits (or consecutively addressed bytes, words, 36-bit words, etc.) are different between the 8-subarray format and the 4-subarray format. Other formats utilizing different numbers of subarrays and/or different numbers of sub-columns per subarray for storing the selected size of data block may be used.

Control circuitry 266 may be responsive to commands and/or address indicators sent (e.g., via the CAW[ ] bus) by controller 260. These commands and/or address indicators may cause control circuitry to store a fixed or selected size data block into array 201 using different numbers of subarrays, sub-columns, and/or formats. These commands and/or address indicators may cause control circuitry to read the fixed or selected size data block from array 201 using different numbers of subarrays, sub-columns, and/or formats. These commands and/or address indicators may also cause control circuitry 266 to use a different number of sub-column access operations on the subarrays of array 201 to store and/or read a fixed or selected size data block to/from array 201.

In an embodiment, control circuitry 266 activates a first number of subarrays of memory array 201 in response to a first indicator. Control circuitry 266 may activate the first number of subarrays by activating a row in each of the first number of subarrays. This first indicator may be received from controller 260. This first indicator may be included in a command received from controller 260. This first indicator may be included as part of an address received from controller 260. After activating the first number of subarrays, control circuitry 266 can access a data block using column access operations. These column access operations may select the data from sense amplifiers corresponding to a sub-column of a sub-row and forward that data for coupling to an interface. Control circuitry 266 may use a first number of column access operations per subarray to transfer the block of data to the interface.

Control circuitry 266 also activates a second number of subarrays of memory array 201 in response to a second indicator. The second number of subarrays being different than the first number of subarrays. Control circuitry 266 may activate the second number of subarrays by activating a sub-row in each of the second number of subarrays. This second indicator may be received from controller 260. This second indicator may be included in a command received from controller 260. This second indicator may be included as part of an address received from controller 260. After activating the second number of subarrays, control circuitry 266 can access a data block using column access operations. These column access operations may select the data from sense amplifiers corresponding to a sub-column of a sub-row and forward that data for coupling to an interface. Control circuitry 266 may use a second number of column access operations per subarray to transfer the block of data to the interface.

For example, a 288-bit block of data may be accessed and sent to an interface using eight (8) subarrays and one (1) sub-column access operation per subarray each transferring 36 bits from the sense amplifiers. A different 288-bit block of data may be accessed using four (4) subarrays and two (2) sub-column access operations each transferring 36 bits from the sense amplifiers. In another example, a 576-bit block of data may be accessed and sent to an interface using eight (8) subarrays and two (2) sub-column access operations per subarray each transferring 36 bits from the sense amplifiers. A different 576-bit block of data may be accessed using four (4) subarrays and four (4) sub-column access operations each transferring 36 bits from the sense amplifiers.

Figure 3:
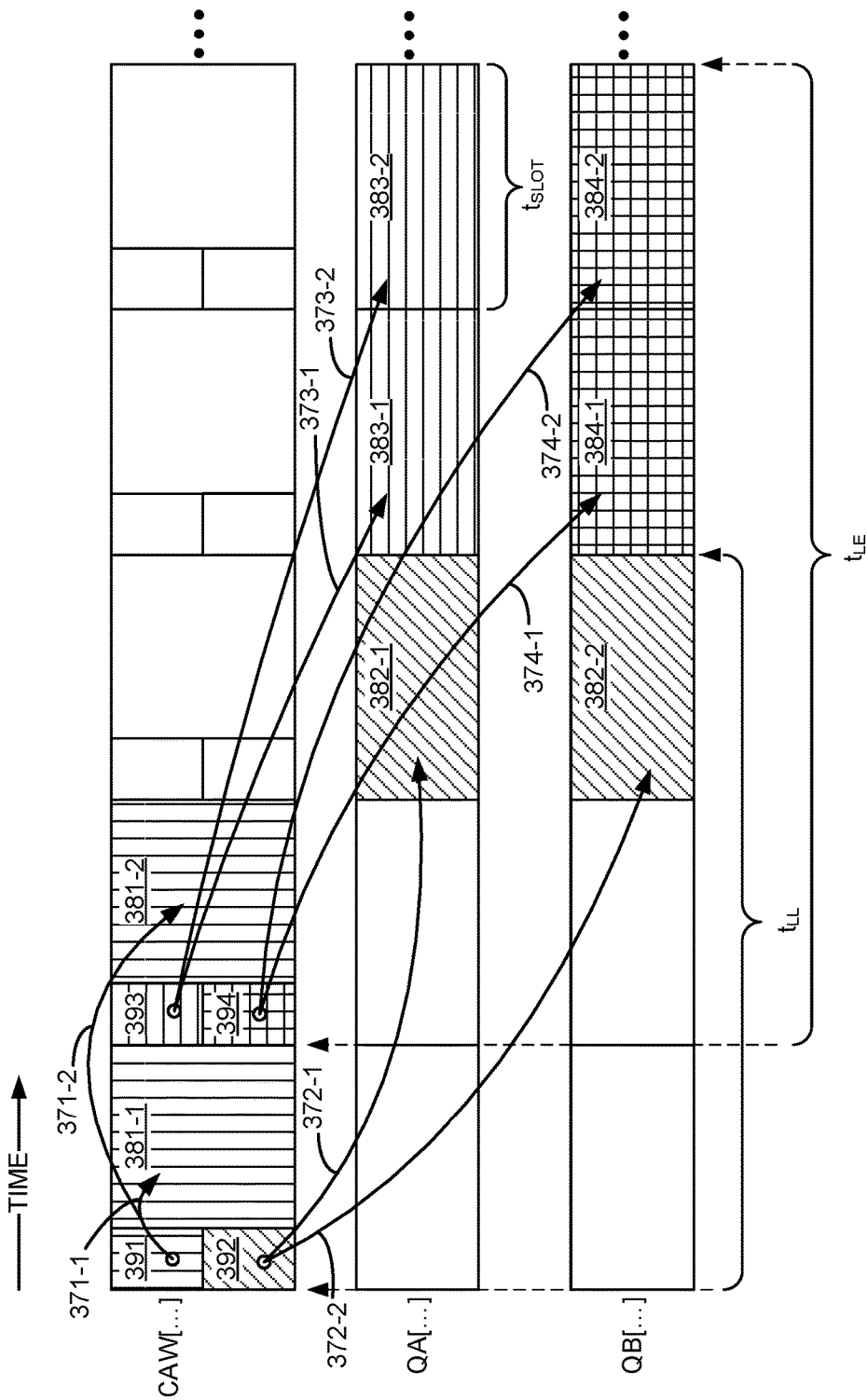
FIG. 3 illustrates a bus protocol with low-latency and low-energy accesses.

FIG. 3 illustrates a bus protocol with low-latency and low-energy accesses. The bus protocol illustrated in FIG. 3 may be used for communication of commands, addresses, and data between controller 260 and memory device 265. In FIG. 3, time is illustrated on the horizontal axis. The contents of a command/address/write bus (e.g., CAW[ ]), a first half-bandwidth data bus (e.g., QA[ ]), and a second half-bandwidth data bus (e.g., QB[ ]) are illustrated. FIG. 3 begins with controller 260 concurrently issuing a write command 391 and a low-latency (i.e., full-bandwidth) read command 392 on the CAW[ ] bus. Controller 260 follows these two concurrently issued commands with partial write data 381-1 associated with write command 391. This is illustrated in FIG. 3 by arrow 371-1 running from write command 391 to write data 381-1.

After write data 381-1 is sent via the CAW[ ] bus, controller 260 concurrently issues a first low-energy (i.e., half-bandwidth) read command 393 and a second low-energy read command 394. After controller 260 sends these two concurrently issued commands, controller 260 sends the remaining write data 381-2 associated with write command 391. This is illustrated in FIG. 3 by arrow 371-2 running from write command 391 to write data 381-2.

In response to low-latency read command 392, memory device 265 (under the control of control circuitry 266) returns the read data block associated with read command 392 via both the QA[ ] bus and the QB[ ] bus. This is illustrated in FIG. 3 by arrows 372-1 and 372-2 running from low-latency read command 392 to read data 382-1 on QA[ ] bus and read data 382-2 on QB[ ] bus, respectively. The low-latency access time, which is measured from the start of the transmission of low-latency read command 392 to the end of the transmissions of read data 382-1 and 382-2 is illustrated in FIG. 3 as $t_{LL}$. In FIG. 3, $t_{LL}$ is illustrated as three time intervals (a.k.a. time slots). Each of these time intervals is equal to the time to transmit the data for a low-latency read command.

In response to low-energy read command 393, memory device 265 (under the control of control circuitry 266) returns the read data block associated with read command 393 via consecutive time slots on the QA[ ] bus. This is illustrated in FIG. 3 by arrows 373-1 and 373-2 running from low-energy read command 393 to read data 383-1 and 383-2, respectively, on the QA[ ] bus. The low-energy access time, which is measured from the start of the transmission of low-energy read command 393 to the end of the transmissions of read data 383-2 is illustrated in FIG. 3 as $t_{LE}$. In FIG. 3, $t_{LE}$ is illustrated as four time intervals (a.k.a. time slots). Each of these time intervals is equal to the time to transmit the data for a low-latency read command. Note that the start of the transmission of read data 383-1 begins two time slots after the start of the transmission of read command 393. Thus, this protocol is configured such that delay from the start of the transmission of either a low-energy command or a low-latency command to the start of the return data is the same. However, since the low-energy command uses only half of the total bandwidth available, the low-energy command completes transmitting the return data after a longer delay.

In response to low-energy read command 394, memory device 265 (under the control of control circuitry 266) returns the read data block associated with read command 394 via consecutive time slots on the QB[ ] bus. This is illustrated in FIG. 3 by arrows 374-1 and 374-2 running from low-energy read command 394 to read data 384-1 and 384-2, respectively, on the QB[ ] bus.

Figure 4:
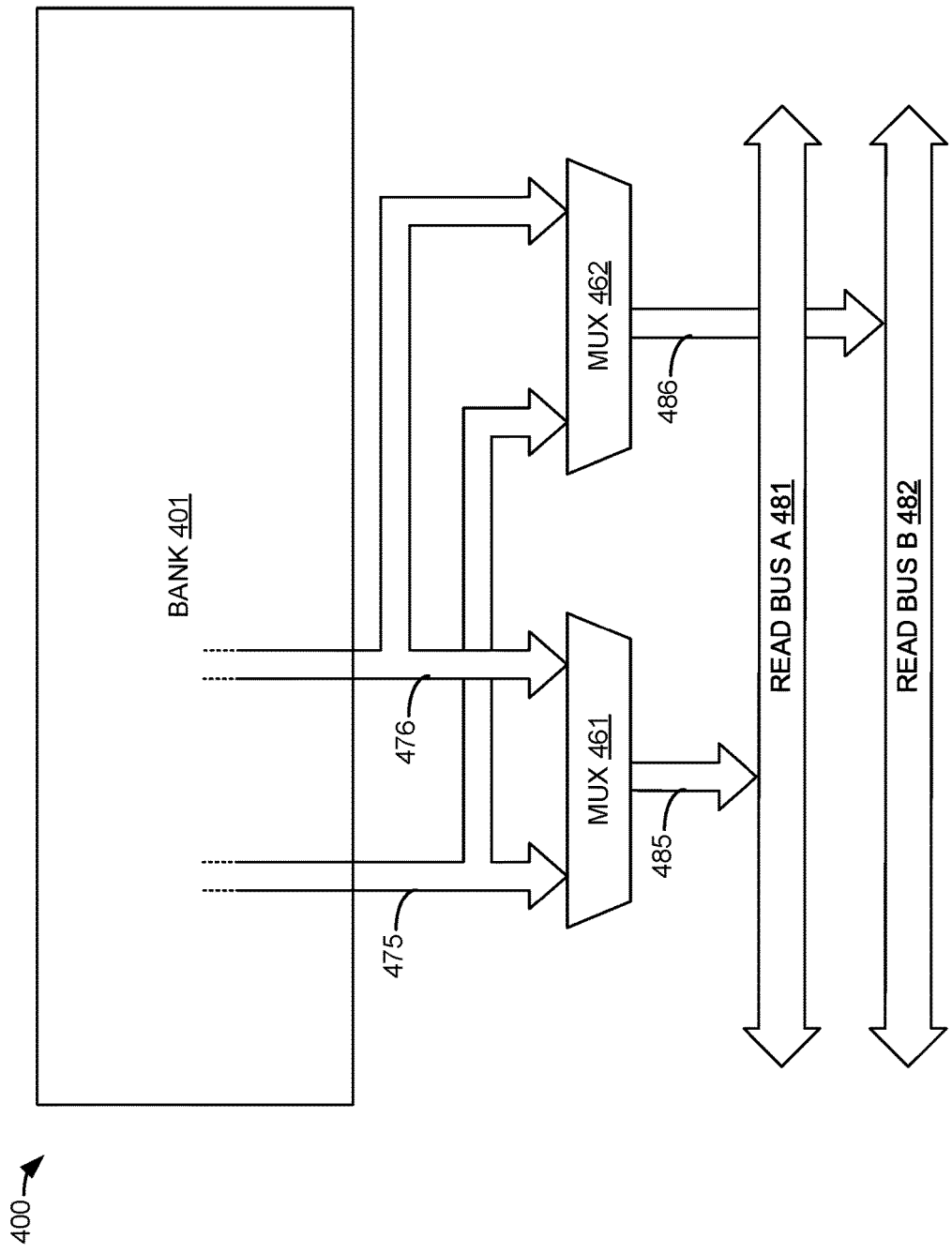
FIG. 4 illustrates internal memory device busses that support low-latency and low-energy accesses.

FIG. 4 illustrates internal memory device busses that support low-latency and low-energy accesses. In FIG. 4, memory device 400 comprises memory bank 401, sub-column output bits 475, sub-column output bits 476, MUX 461, MUX 462, read bus A 481, and read bus B 482. MUX 461 is operatively coupled to receive sub-column output bits 475, sub-column output bits 476 and provide bus A data 485 to read bus A 481. MUX 462 is operatively coupled to receive sub-column output bits 475, sub-column output bits 476 and provide bus B data 486 to read bus B 482. Thus, it should be understood from FIG. 4 that the bits output by the sense amplifiers corresponding to a sub-column of a subarray (e.g., subarray 111) can be steered to either read bus A 481 or read bus B 482. In this manner, control circuitry 266 can send the data from a full-bandwidth read to both read bus A 481 and read bus B 482 simultaneously for output on QA[ ] and QB[ ]. Control circuitry can also send the data from a half-bandwidth read to either read bus A 481 or read bus B 482, as indicated by controller 260.

Figure 5:
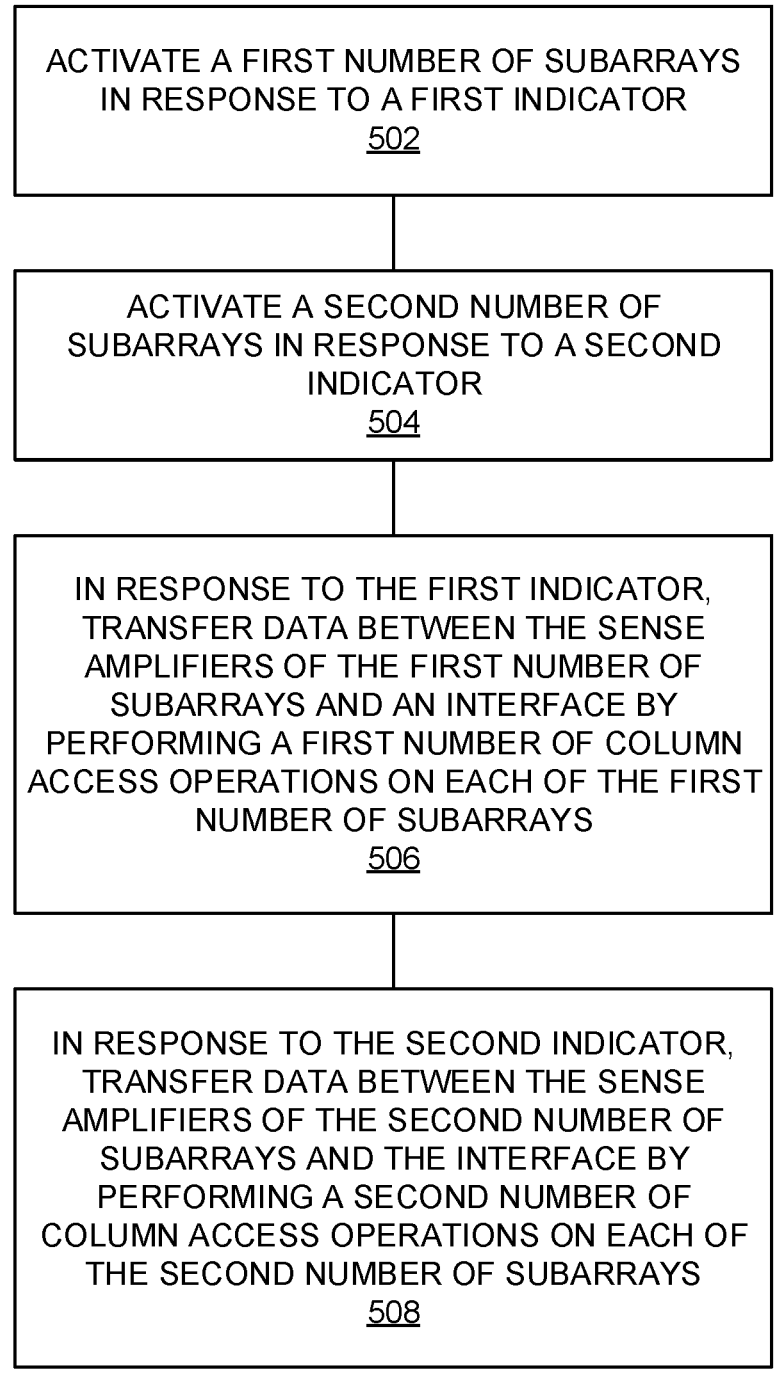
FIG. 5 is a flowchart illustrating a method of accessing a memory device.

FIG. 5 is a flowchart illustrating a method of accessing a memory device. The steps illustrated in FIG. 5 may be performed by one or more elements of memory device 265 and/or memory device 400. A first number of subarrays are activated in response to a first indicator (502). For example, control circuitry 266 may activate a first number of subarrays by activating a sub-row in each of the first number of subarrays. This first indicator may be received from controller 260. This first indicator may be included in a first type of command received from controller 260. This first indicator may be included as part of a first address received from controller 260.

A second number of subarrays are activated in response to a second indicator (504). For example, control circuitry 266 may activate a second number of subarrays of memory array 201 in response to a second indicator. The second number of subarrays may be different than the first number of subarrays. Control circuitry 266 may activate the second number of subarrays by activating a sub-row in each of the second number of subarrays. This second indicator may be received from controller 260. This second indicator may be included in a second type of command received from controller 260. This second indicator may be included as part of a second address received from controller 260.

In response to the first indicator, data is transferred between the sense amplifiers of the first number of subarrays and an interface by performing a first number of column access operations on each of the first number of subarrays (506). For example, after activating a sub-row in the first number of subarrays, control circuitry 266 can access a data block using column access operations that select the data from sense amplifiers corresponding to a sub-column of a sub-row, and forward that data for coupling to an interface (e.g., both QA[ ] and QB[ ].) Control circuitry 266 may use a first number of column access operations per subarray to transfer the block of data to the interface.

In response to the second indicator, data is transferred between the sense amplifiers of the second number of subarrays and an interface by performing a second number of column access operations on each of the second number of subarrays (508). For example, after activating the second number of subarrays, control circuitry 266 can access a data block using column access operations that select the data from sense amplifiers corresponding to a sub-column of a sub-row and forward that data for coupling to an interface (e.g., one of QA[ ] and QB[ ].) Control circuitry 266 may use a second number of column access operations per subarray to transfer the block of data to the interface.

The systems and devices described above may be implemented in computer systems, integrated circuits, or stored by computer systems. The systems described above may also be stored on a non-transitory computer readable medium. Devices, circuits, and systems described herein may be implemented using computer-aided design tools available in the art, and embodied by computer-readable files containing software descriptions of such circuits. This includes, but is not limited to, one or more elements of memory array 101, subarrays 111, system 200, device 400, and their components. These software descriptions may be: behavioral, register transfer, logic component, transistor, and layout geometry-level descriptions. Moreover, the software descriptions may be stored on non-transitory storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½-inch floppy media, CDs, DVDs, Blu-Ray, and so on.

Figure 6:
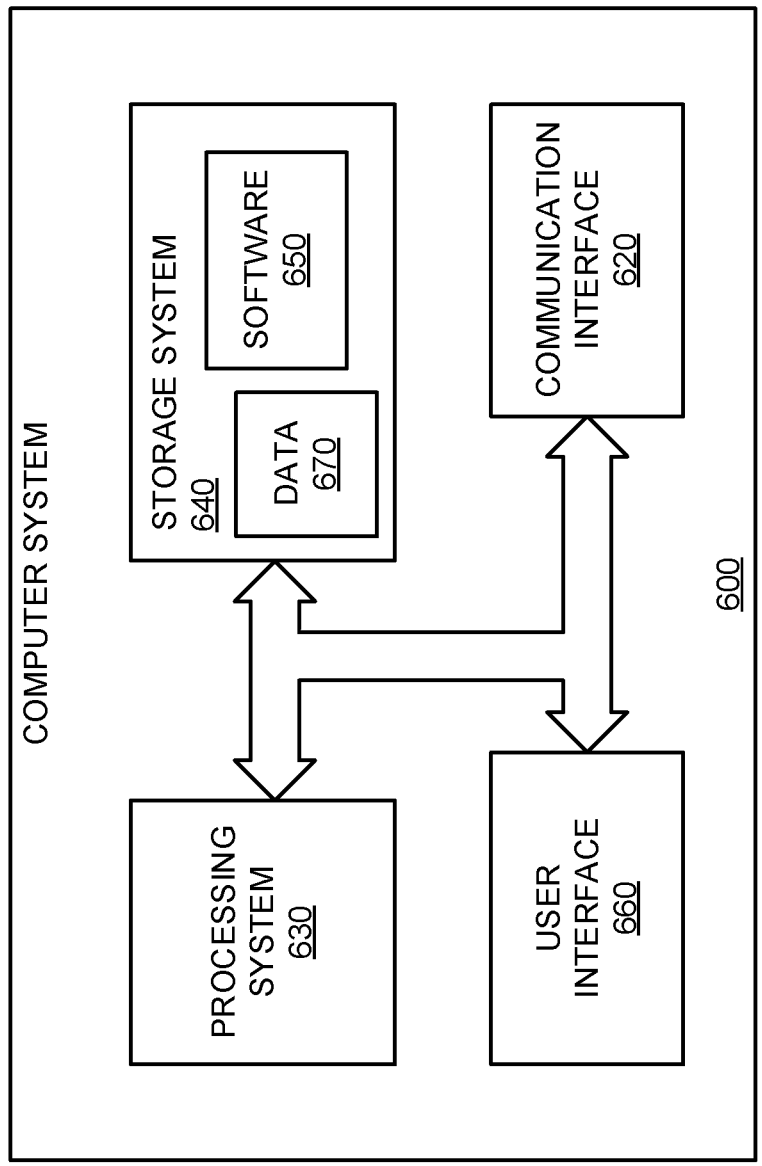
FIG. 6 is a block diagram of a computer system.

FIG. 6 illustrates a block diagram of a computer system. Computer system 600 includes communication interface 620, processing system 630, storage system 640, and user interface 660. Processing system 630 is operatively coupled to storage system 640. Storage system 640 stores software 650 and data 670. Computer system 600 may include one or more of memory array 101, subarrays 111, system 200, device 400, and their components, or components that implement the methods, circuits, and/or protocols described herein. Processing system 630 is operatively coupled to communication interface 620 and user interface 660. Computer system 600 may comprise a programmed general-purpose computer. Computer system 600 may include a microprocessor. Computer system 600 may comprise programmable or special purpose circuitry. Computer system 600 may be distributed among multiple devices, processors, storage, and/or interfaces that together comprise elements 620-670.

Communication interface 620 may comprise a network interface, modem, port, bus, link, transceiver, or other communication device. Communication interface 620 may be distributed among multiple communication devices. Processing system 630 may comprise a microprocessor, microcontroller, logic circuit, or other processing device. Processing system 630 may be distributed among multiple processing devices. User interface 660 may comprise a keyboard, mouse, voice recognition interface, microphone and speakers, graphical display, touch screen, or other type of user interface device. User interface 660 may be distributed among multiple interface devices. Storage system 640 may comprise a disk, tape, integrated circuit, RAM, ROM, EEPROM, flash memory, network storage, server, or other memory function. Storage system 640 may include computer readable medium. Storage system 640 may be distributed among multiple memory devices.

Processing system 630 retrieves and executes software 650 from storage system 640. Processing system 630 may retrieve and store data 670. Processing system 630 may also retrieve and store data via communication interface 620. Processing system 630 may create or modify software 650 or data 670 to achieve a tangible result. Processing system 630 may control communication interface 620 or user interface 660 to achieve a tangible result. Processing system 630 may retrieve and execute remotely stored software via communication interface 620.

Software 650 and remotely stored software may comprise an operating system, utilities, drivers, networking software, and other software typically executed by a computer system. Software 650 may comprise an application program, applet, firmware, or other form of machine-readable processing instructions typically executed by a computer system. When executed by processing system 630, software 650 or remotely stored software may direct computer system 600 to operate.

Implementations discussed herein include, but are not limited to, the following examples:

Example 1

A method of operating a memory component, comprising: accessing, utilizing a first number of memory subarrays, a first block of data having a first size, the first block of data being stored in the memory subarrays in a first format; and, accessing, utilizing a second number of memory subarrays, a second block of data having the first size, the second block of data being stored in the memory subarrays in a second format, the first number being different from the second number.

Example 2

The method of example 1, wherein the second number is twice the first number.

Example 3

The method of example 1, wherein the memory subarrays include sense amplifiers, and accessing the memory subarrays includes a row access that places data stored by a sub-row of storage cells into sense amplifiers of a utilized memory subarray, and accessing the memory subarrays also includes a column access operation that moves data between the sense amplifiers and an interface.

Example 4

The method of example 3, wherein the accessing utilizing the first number of memory subarrays comprises at least twice the number of column access operations per subarray than the accessing utilizing the second number of memory subarrays.

Example 5

The method of example 4, wherein first column access cycles are used to read data from the sense amplifiers of the utilized memory subarray and second column access cycles are used to write data to the sense amplifiers of the utilized memory subarray.

Example 6

The method of example 1, further comprising: receiving an indicator of the number of column access cycles per subarray to be used to access the memory subarrays.

Example 7

The method of example 1, further comprising: receiving an indicator that determines whether data being stored in the memory subarrays is to be in a format selected from a group comprising at least the first format and the second format.

Example 8

A memory device, comprising: a memory array comprising a plurality of subarrays, the subarrays comprising sense amplifiers and storage cells, the storage cells of a respective subarray to be accessed via row activation operations and column access operations, the column access operations to move data between the sense amplifiers and an interface; and, control circuitry configured to perform a first access of a first block of data having a first size, the first access of the first block of data to utilize a first number of the subarrays where the first block of data is to be stored in the subarrays according to a first format, the control circuitry also configured to perform a second access of a second block of data having a second size, the second access of the second block of data to utilize a second number of the subarrays where the second block of data is to be stored in the subarrays according to a second format.

Example 9

The memory device of example 8, wherein the control circuitry is to receive an indicator that determines which of at least the first number of subarrays and the second number of subarrays is utilized by a particular access.

Example 10

The memory device of example 8, wherein the control circuitry is to receive an indicator that determines which of at least the first format and the second format is to be utilized by a particular access.

Example 11

The memory device of example 8, wherein the control circuitry is configured to perform the first access using a first number of column access operations per subarray and is also configured to perform the second access using a second number of column access operations per subarray, the first number of column access operations per subarray to be different from the second number of column access operations per subarray.

Example 12

The memory device of example 11, wherein the second number of column access operations per subarray is less than one-half the second number of column access operations per subarray.

Example 13

The memory device of example 11, wherein the control circuitry is to receive an indicator that determines a number of column access operations per subarray to be used to perform a particular access.

Example 14

The memory device of example 8, wherein the first access and the second access are to be a one of a read access and a write access.

Example 15

A method of operating a memory component, comprising: activating a first number of subarrays of a memory array in response to a first indicator, the subarrays comprising sense amplifiers and storage cells, the storage cells of a respective subarray to be accessed via column access operations, the column access operations to move data between the sense amplifiers and an interface; and, activating a second number of subarrays of the memory array in response to a second indicator, the first number of subarrays being different from the second number of subarrays.

Example 16

The method of example 15, further comprising: in response to the first indicator, transferring data between the sense amplifiers of the first number of subarrays and an interface by performing a first number of column access operations on each of the first number of subarrays; and, in response to the second indicator, transferring data between the sense amplifiers of the second number of subarrays and the interface by performing a second number of column access operations on each of the second number of subarrays, wherein the first number of column operations is different from the second number of column operations.

Example 17

The method of example 16, wherein transferring data between the sense amplifiers of the first number of subarrays and the interface stores data in the first number of subarrays according to a first format and transferring data between the sense amplifiers of the second number of subarrays and the interface stores data in the second number of subarrays according to a second format.

Example 18

The method of example 16, wherein the first indicator is received via a first instruction and the second indicator is received via a second instruction, the first instruction and the second instruction provided to the memory component via a command/address interface.

Example 19

The method of example 17, further comprising: reading data from the first number of subarrays that was stored according to the second format.

Example 20

The method of example 18, wherein the first instruction is used to read data stored according to the second format from the first number of subarrays.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of operating a memory component, comprising:
accessing, utilizing a first number of memory subarrays in a first row of memory subarrays, a first consecutively addressed block of data having a first size, the first consecutively addressed block of data being stored in the first number of memory subarrays in a first format, the first number being greater than one; and,
accessing, utilizing a second number of memory subarrays in a second row of memory subarrays, a second consecutively addressed block of data having the first size, the second consecutively addressed block of data being stored in the second number of memory subarrays in a second format, the first number being different from the second number, the second number being greater than one, the first row of memory subarrays having a total number of memory subarrays, the second row of memory subarrays having the total number of memory subarrays, the first number and the second number both being less than the total number.

2. The method of claim 1, wherein the second number is twice the first number.

3. The method of claim 1, wherein the memory subarrays include sense amplifiers, and accessing the memory subarrays includes a row access that places data stored by a sub-row of storage cells into sense amplifiers of a utilized memory subarray, and accessing the memory subarrays also includes a column access operation that moves data between the sense amplifiers and an interface.

4. The method of claim 3, wherein the accessing utilizing the first number of memory subarrays comprises at least twice the number of column access operations per subarray than the accessing utilizing the second number of memory subarrays.

5. The method of claim 4, wherein first column access cycles are used to read data from the sense amplifiers of the utilized memory subarray and second column access cycles are used to write data to the sense amplifiers of the utilized memory subarray.

6. The method of claim 1, further comprising:
receiving an indicator of the number of column access cycles per subarray to be used to access the memory subarrays.

7. The method of claim 1, further comprising:
receiving an indicator that determines whether data being stored in the memory subarrays is to be in a format selected from a group comprising at least the first format and the second format.

8. A memory device, comprising:
a memory array comprising a plurality of subarrays, the subarrays comprising sense amplifiers and storage cells, the storage cells of a respective subarray to be accessed via row activation operations and column access operations, the column access operations to move data between the sense amplifiers and an interface; and,
control circuitry configured to perform a first access of a first consecutively addressed block of data having a first size, the first access of the first consecutively addressed block of data to utilize a first number of the subarrays of a first row of subarrays, the first number being greater than one, where the first consecutively addressed block of data is to be stored in the first row of subarrays according to a first format, the control circuitry also configured to perform a second access of a second consecutively addressed block of data having a second size, the second access of the second consecutively addressed block of data to utilize a second number of the subarrays of a second row of subarrays, the second number being greater than one, where the second consecutively addressed block of data is to be stored in the second row of subarrays according to a second format, the first row of subarrays having at total number of subarrays, the second row of subarrays having the total number of subarrays, and the first number and the second number being less than the total number.

9. The memory device of claim 8, wherein the control circuitry is to receive an indicator that determines which of at least the first number of subarrays and the second number of subarrays is utilized by a particular access.

10. The memory device of claim 8, wherein the control circuitry is to receive an indicator that determines which of at least the first format and the second format is to be utilized by a particular access.

11. The memory device of claim 8, wherein the control circuitry is configured to perform the first access using a first number of column access operations per subarray and is also configured to perform the second access using a second number of column access operations per subarray, the first number of column access operations per subarray to be different from the second number of column access operations per subarray.

12. The memory device of claim 11, wherein the second number of column access operations per subarray is less than one-half the second number of column access operations per subarray.

13. The memory device of claim 11, wherein the control circuitry is to receive an indicator that determines a number of column access operations per subarray to be used to perform a particular access.

14. The memory device of claim 8, wherein the first access and the second access are to be a one of a read access and a write access.

15. A method of operating a memory component, comprising:
activating a first number of subarrays in a first row of subarrays of a memory array in response to a first indicator, the subarrays comprising sense amplifiers and storage cells, the storage cells of a respective subarray to be accessed via column access operations, the column access operations to move consecutively addressed data between the sense amplifiers and an interface; and,
activating a second number of subarrays in a second row of subarrays of the memory array in response to a second indicator, the first number of subarrays being different from the second number of subarrays, the first row of subarrays having a total number of subarrays, the second row of subarrays having the total number of subarrays, where the first number and the second number are both less than the total number.

16. The method of claim 15, further comprising:
in response to the first indicator, transferring consecutively addressed data between the sense amplifiers of the first number of subarrays and an interface by performing a first number of column access operations on each of the first number of subarrays; and,
in response to the second indicator, transferring consecutively addressed data between the sense amplifiers of the second number of subarrays and the interface by performing a second number of column access operations on each of the second number of subarrays, wherein the first number of column operations is different from the second number of column operations.

17. The method of claim 16, wherein transferring consecutively addressed data between the sense amplifiers of the first number of subarrays and the interface stores consecutively addressed data in the first number of subarrays according to a first format and transferring consecutively addressed data between the sense amplifiers of the second number of subarrays and the interface stores consecutively addressed data in the second number of subarrays according to a second format.

18. The method of claim 16, wherein the first indicator is received via a first instruction and the second indicator is received via a second instruction, the first instruction and the second instruction provided to the memory component via a command/address interface.

19. The method of claim 17, further comprising:
reading consecutively addressed data from the first number of subarrays that was stored according to the second format.

20. The method of claim 18, wherein the first instruction is used to read consecutively addressed data stored according to the second format from the first number of subarrays.

* * * * *